United States Patent
Kumar et al.

(10) Patent No.: US 12,034,455 B2
(45) Date of Patent: Jul. 9, 2024

(54) ITERATION DEPENDENT BITWISE BIT FLIPPING DECODER

(71) Applicant: PetalO Inc., Santa Clara, CA (US)

(72) Inventors: Naveen Kumar, San Jose, CA (US); Lingqi Zeng, San Jose, CA (US)

(73) Assignee: PETAIO INC., Santa Clara, CA (US)

( * ) Notice: Subject to any disclaimer, the term of this patent is extended or adjusted under 35 U.S.C. 154(b) by 0 days.

(21) Appl. No.: 17/947,635

(22) Filed: Sep. 19, 2022

(65) Prior Publication Data

US 2024/0088916 A1     Mar. 14, 2024

Related U.S. Application Data

(63) Continuation of application No. 17/940,878, filed on Sep. 8, 2022.

(51) Int. Cl.
*H03M 13/00*     (2006.01)
*H03M 13/11*     (2006.01)

(52) U.S. Cl.
CPC .... *H03M 13/1108* (2013.01); *H03M 13/1122* (2013.01); *H03M 13/1128* (2013.01)

(58) Field of Classification Search
CPC ......... H03M 13/1108; H03M 13/3715; H03M 13/3723; H03M 13/3753
See application file for complete search history.

(56) References Cited

U.S. PATENT DOCUMENTS

| | | | |
|---|---|---|---|
| 10,389,388 B2* | 8/2019 | Tate | H03M 13/11 |
| 11,018,695 B1* | 5/2021 | Zhang | H03M 13/1108 |
| 11,108,407 B1* | 8/2021 | Lu | H03M 13/1111 |
| 11,146,289 B2* | 10/2021 | Bhatia | H03M 13/1108 |
| 11,146,290 B1* | 10/2021 | Xiong | H03M 13/1111 |
| 11,381,253 B1* | 7/2022 | Asadi | H03M 13/1148 |
| 11,689,217 B2* | 6/2023 | Kaynak | H03M 13/2948 |
| | | | 714/758 |

* cited by examiner

*Primary Examiner* — Esaw T Abraham
(74) *Attorney, Agent, or Firm* — David R. Stevens; Stevens Law Group (57) ABSTRACT

An LDPC decoder receives channel information and performs a bit flipping algorithm to correct unsatisfied checks with respect to a parity matrix H. The threshold condition for determining whether to flip a bit is a function of the channel information itself. A threshold $Th_k$ used to evaluate the threshold condition may vary between iterations based on the number of iterations, number of bits flipped in the previous iteration, and number of unsatisfied checks. A threshold $Th^k_i$ may be calculated for each bit position. $Th^k_i$ and the threshold condition may be a function of whether bit position i was flipped in a previous iteration. A binning approach for parameters of the threshold condition may be used to reduce hardware complexity.

19 Claims, 5 Drawing Sheets

ITERATION DEPENDENT BITWISE BIT FLIPPING DECODER

RELATED APPLICATIONS

This application is a continuation of U.S. application Ser. No. 17/940,878, entitled "Bit Flipping Decoder Using Channel Information" filed Sep. 8, 2022, which is hereby incorporated herein by reference in their entirety.

BACKGROUND

Field of the Invention

This invention relates to systems and methods for decoding data using low density parity code (LDPC).

Background of the Invention

The data storage industry has gone through revolutionary changes since the emergence and maturity of NAND flash technologies. With NAND flash's exceptional performance and low power consumption, it is just a matter of time before NAND flash storage devices will be the choice for every computer and data center. However, one barrier to adoption is the cost. As NAND technologies continue advancing rapidly, the cost of NAND flash storage devices is also going down quickly and becoming more acceptable to consumers and enterprise customers.

While the cost of NAND flash is reducing, the reliability is also reducing. Therefore, advanced error correction coding schemes, such as LDPC (low density parity check) codes, are required to be employed in order to guarantee the data reliability as well as improve the usable lifetime of the NAND flash storage devices.

The bit-flipping decoding algorithm was first invented by Gallager in his famous thesis on LDPC Codes more than half century ago (see R. G. Gallager, "Low-Density Parity-Check Codes", in Research Monograph series. Cambridge, MIT Press, 1963, which is hereby incorporated herein by reference in its entirety). The general idea of the bit-flipping decoder is to count the number of unsatisfied checks for each data bit and then flip those ones with the maximum number of unsatisfied checks. The above process will repeat until all checks are satisfied or a predetermined maximum number of iterations is reached. One example implementation of a bit-flipping decoding algorithm is described in U.S. Publication 2016/0197624, which is hereby incorporated herein by reference in its entirety.

It would be an advancement in the art to improve the implementation of LDPC error correction in a NAND flash storage device.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
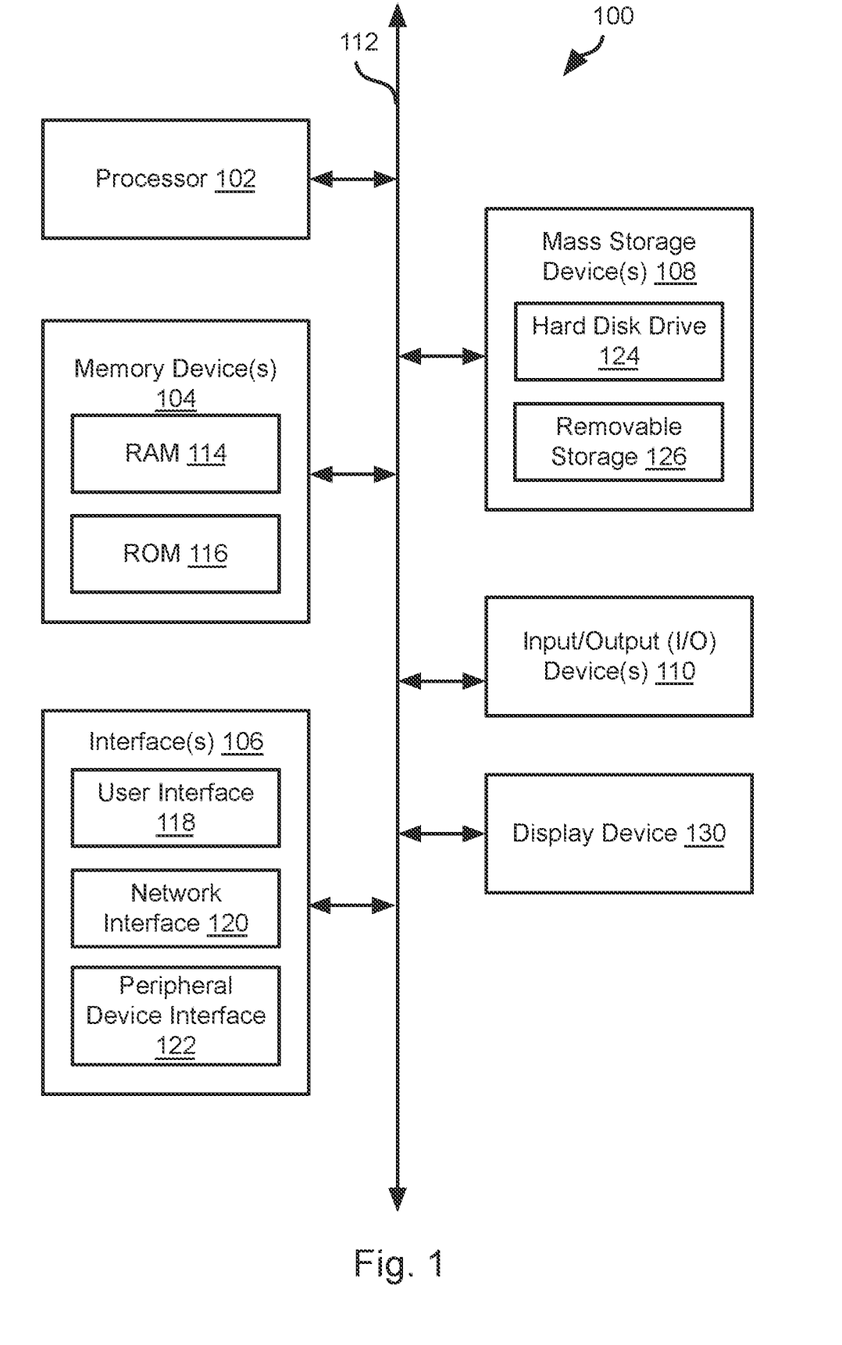
FIG. 1 is a schematic block diagram of a computing system suitable for implementing an approach in accordance with embodiments of the invention.

FIG. 1 is a block diagram illustrating an example computing device 100. Computing device 100 may be used to perform various procedures, such as those discussed herein. Computing device 100 can function as a server, a client, or any other computing entity. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device (s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
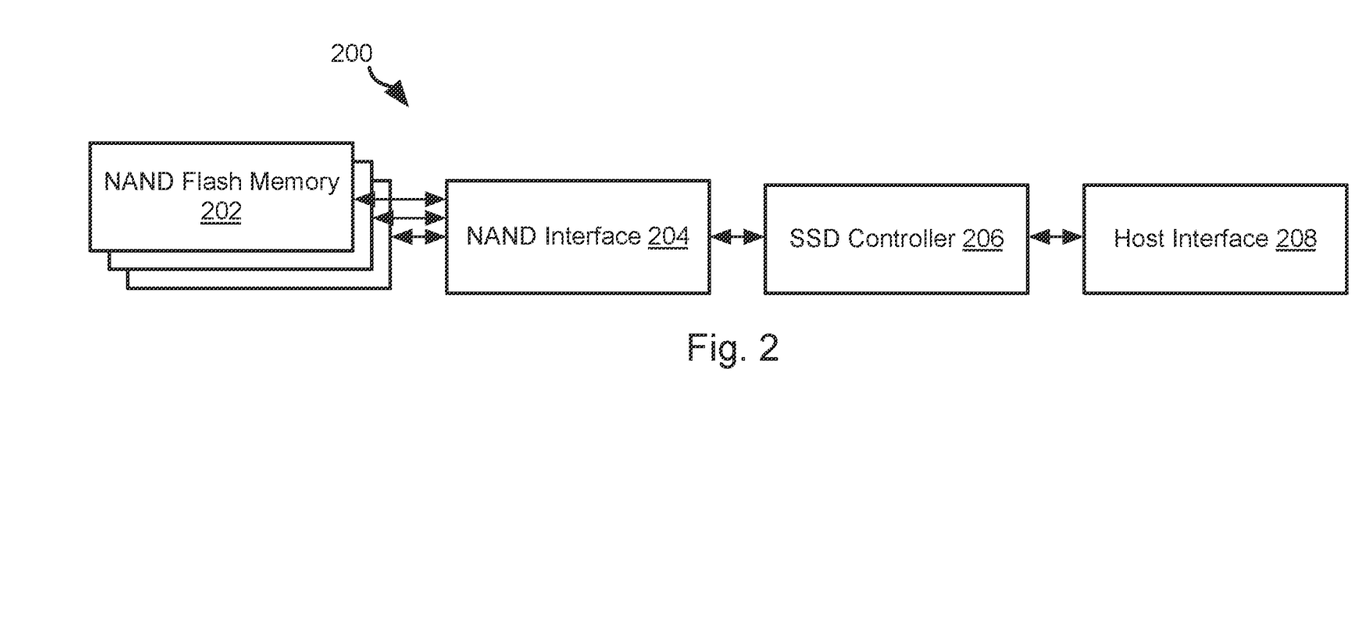
FIG. 2 is a schematic block diagram of components of a storage system that may implement an approach in accordance with an embodiment of the present invention.

Referring to FIG. 2, a typically flash storage system 200 includes a solid state drive (SSD) that may include a plurality of NAND flash memory devices 202. One or more NAND devices 202 may interface with a NAND interface 204 that interacts with an SSD controller 206. The SSD controller 206 may receive read and write instructions from a host interface 208 implemented on or for a host device, such as a device including some or all of the attributes of the computing device 100. The host interface 208 may be a data bus, memory controller, or other components of an input/output system of a computing device, such as the computing device 100 of FIG. 1.

The methods described below may be performed by the SSD controller 206, the host interface 208, or a combination of the two. The methods described herein may be executed by any component in such a storage device or be performed completely or partially by a host processor coupled to the storage device.

Figure 3:
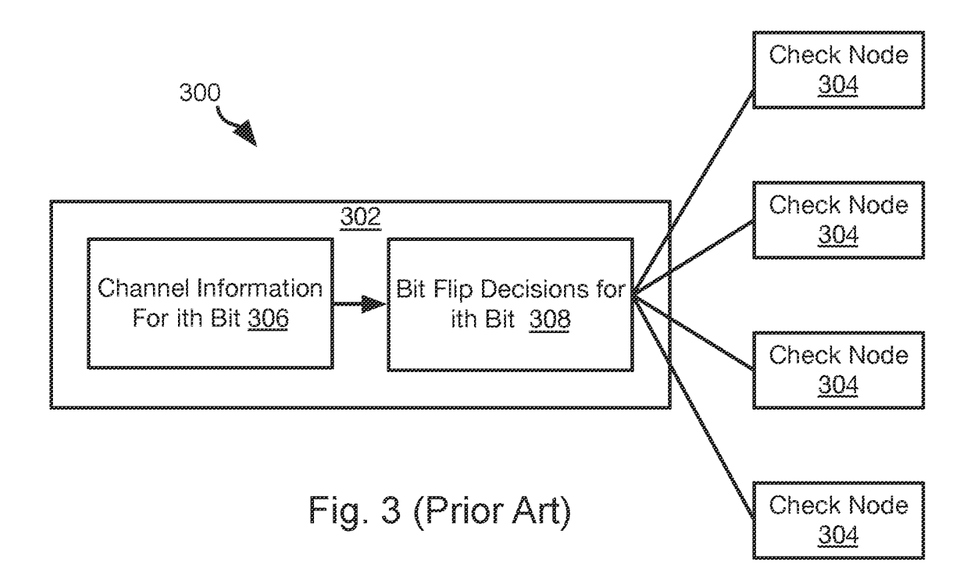
FIG. 3 is schematic block diagram illustrating a bit flipping algorithm in accordance with the prior art.

FIG. 3 is a diagram 300 to facilitate understanding of a bit flipping algorithm. A variable node 302 is connected to a plurality of check nodes 304. The variable node 320 may include channel information 306 for each bit position i, i=1 to n, where n is the number of bits. The channel information 306 for a bit position i may represent an original binary value as read from the NAND flash memory 202 without error correction. The variable node 320 for each bit position i further includes a bit flip decision 308 for bit position i indicates a current value of a bit i in a codeword derived from the channel information using the bit flipping algorithm. Hereinafter, the channel information (i.e., an original data word) read from the NAND flash memory is designated as $C_i$ representing the binary value for each bit position i of the channel information. Hereinafter, the bit flip decision 308 for bit position i is designated as $BF_i$. Prior to performing bit flipping, $BF_i$ may be set to $C_i$ for all bit positions i.

For each variable node 302, there will be a number of check nodes 304 connected to it. The check nodes 304 are defined according to a parity check matrix H and the LDPC codewords CW defined for the parity check matrix H. Each LDPC codeword CW has a length n and is generated based on m input bits, where p=(n−m) is the parity used to generate this LDPC codeword such that $CW*H^T=0$. H may be a matrix $H_{ji}$, i=1 to n and j=1 to p. In essence, the xor of each CW with each row of H will be zero. H has p rows such that there will be p checks.

Each check node 304 may be defined as corresponding to a value of H that is non-zero. Accordingly, a variable node 302 for a given bit position i=i0 is therefore connected to one or more check nodes 304 corresponding to values $H_{ji0}$ that are non-zero. The degree $\gamma_i$ is used herein to designate the number of check nodes 304 connected to the variable node 302 for bit position i. The value $\gamma_{max}$ as used herein refers to the largest degree $\gamma_i$ of all the bit positions i.

In the discussion below, $USC_i$ denotes the unsatisfied check information for ith variable node 302, i.e. $BF_i$. Specifically, $USC_i$ specifies how many unsatisfied check nodes 304 are connected to ith variable node 302. An unsatisfied check occurs for each non-zero entry in the vector resulting from $BF*H^T$. Stated differently, an unsatisfied check occurs for each row j of H for which $H_{ji}$ xor $BF_i$ is non-zero for at least one value of i. An unsatisfied check for a row j of H is connected to a particular variable node 302 if $H_{ji}$ is non-zero for the bit position i of the variable node 302. In FIG. 3, the variable node 302 is shown connected with four check nodes 304. If three checks are not satisfied by $BF_i$, $USC_i$ will be equal to three.

Figure 4:
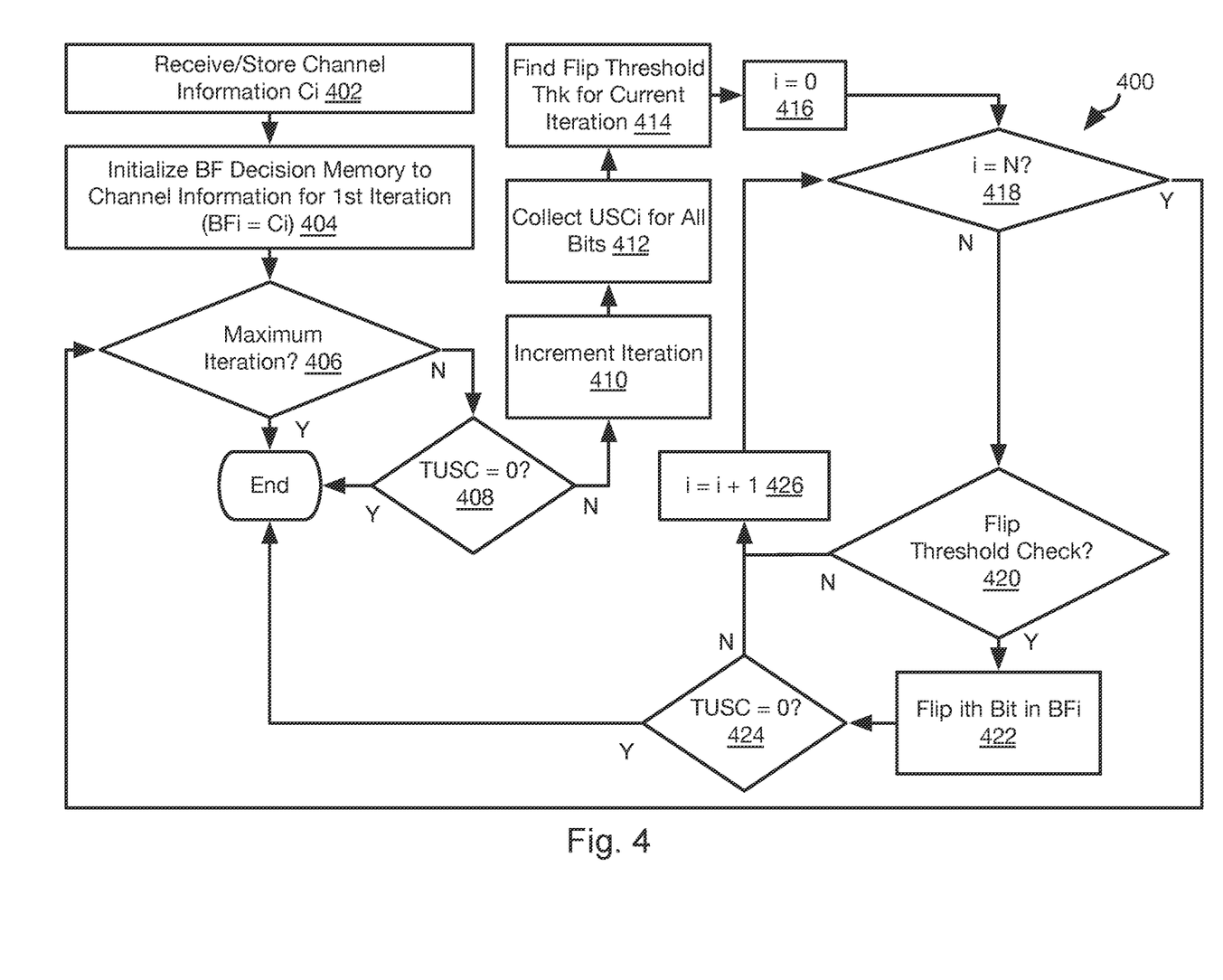
FIG. 4 is a process flow diagram of a bit flipping algorithm in accordance with an embodiment of the present invention.

Other values used in the bit flipping algorithm described below include the values below:
  k: the number of iterations of the bit flipping algorithm.
  $Th_k$: denotes a threshold for the kth iteration which is used to determine where a bit should be flipped or not during the decoding.
  $TUSC_k$: denotes the total unsatisfied checks at the kth iteration.
  $G_i$: denotes the correct genie data for the ith bit in a codeword (i.e., the actual value as written to the NAND flash memory 202 and which is read back as $C_i$).
  $E_i$: denotes the error information which is 1 if there is an error at the ith bit and −1 if the ith bit is correct. It is given as $E_i=-1+2*(C_i$ xor $G_i)$ FIG. 4 illustrates an improved algorithm 400 for performing bit flipping. The bit flipping algorithm 400 judiciously uses the channel information Ci obtained from the NAND flash memory to significantly improve the decoding performance. The bit flipping algorithm 400 does so with low hardware complexity. Prior attempts to perform bit flipping have been published but do not disclose the use of channel information. In US 2020/0136644, which is incorporated herein by reference in its entirety, there is some work related to a bit flipping decoder, however, the work doesn't explore the usage of channel information as described herein.

The problem of the bit flipping algorithm 400 may be formulated according to (1).

$$BF_i = \begin{cases} \text{Flip the } ith \text{ bit if, } \alpha(y_i, TUSC_k)*(BF_i \text{ xor } C_i) + \\ \quad \beta(y_i, TUSC_k)*USC_i \geq Th_k \\ \text{Don't } ith \text{ flip, } \alpha(y_i, TUSC_k)*(BF_i \text{ xor } C_i) + \\ \quad \beta(y_i, TUSC_k)*USC_i \leq Th_k \end{cases} \quad (1)$$

To implement the formulation above, one can select parameters $(\alpha(\gamma_i, TUSC_k), \beta(\gamma_i, TUSC_k), Th_k)$ to increase probability of flipping bits which are in error and reduce probability of flipping correct bits of $C_i$. These parameters can be estimated by collecting training data, which consists of L samples, where L is an integer on the order of $10^6$, $10^7$, or more samples. Each sample may include a pair of values including $G_i$ and $C_i$, where $G_i$ is the genie data written to the NAND flash memory 202 and $C_i$ is the data obtained when reading $G_i$ back from the NAND flash memory 202.

Given the channel information $C_i$ and the genie data $G_i$ for each bit position of each training sample, the problem may be reformulated as (2).

$$(\alpha(\gamma_i, TUSC_k), \beta(\gamma_i, TUSC_k), Th_k) = \text{argmin}(E_i - \alpha(\gamma_i, TUSC_k)*(BF_i \text{ xor } C_i) - \beta(\gamma_i, TUSC_k)*USC_i - Th_k)^2 \quad (2)$$

The above problem can be solved by applying the least square formulation, and the closed form solution is given as (3).

$$(\alpha(\gamma_i, TUSC_k), \beta(\gamma_i, TUSC_k), Th_k) = (A^TA)^{-1}*(A^TB) \quad (3)$$

where A and B are generated from the L training samples according to (4).

$$A = \begin{bmatrix} (BF_1 \text{ xor } C_1) & USC_1 & -1 \\ \vdots & \ddots & \vdots \\ (BF_L \text{ xor } C_L) & USC_L & -1 \end{bmatrix}, B = \begin{bmatrix} C_1 \\ \cdot \\ \cdot \\ \cdot \\ E_L \end{bmatrix} \quad (4)$$

A first drawback of prior implementations is that the threshold is not an integer number, which is not easily implemented in hardware, particularly for system on a chip (SoC) implementations. A second drawback is that the total unsatisfied check (USC) information range can be quite large, and it is burdensome to find the optimal parameters for the entire range of USC. One or both of these drawbacks may be remedied by the algorithm 400. The first drawback may be handled in the algorithm 400 by finding integer thresholds for a given iteration k.

The algorithm 400 may include receiving and storing 402 channel information $C_i$ from the NAND flash memory 202. BF decision memory may further be initialized 404 such that $BF_i = C_i$. The number of iterations of the subsequent steps may be limited to a maximum number of iterations. Accordingly, prior to each iteration, the algorithm 400 may include evaluating 406 whether the number of previous iterations exceeds this maximum. If not, the algorithm 400 may continue by evaluating 408 whether the total number of unsatisfied checks (TUSC) is equal to 0. For the first iteration, step 408 may include determining TUSC of $BF_i$ with respect to H using the approach described above. In subsequent iterations, this evaluation 408 may be omitted since it may be evaluated elsewhere as part of each iteration.

If TUSC is not found 408 to be zero, the algorithm 400 may include incrementing 410 the iteration count, e.g., k=k+1, where k is the iteration count and is initialized to zero prior to the first iteration. The algorithm 400 may include collecting 412 $USC_i$ values of $BF_i$ for all bit positions i using the matrix H using the approach described above. The algorithm 400 may include finding 414 a flip threshold $Th_k$ for the current iteration k. The flip threshold $Th_k$ may advantageously be calculated as an integer to reduce computational complexity.

The pseudo code of Algorithm 1, below, illustrates one approach for calculating a flip threshold $Th_k$.

---
Algorithm 1
---
```
If TUSC <= γ_max
    Th_k =TUSC
Else
    If k=1
        Th_k = Th_A
    Else
        If number of bits flips in the last iteration from the decoder = 0
            Th_k = func(Th_{k-1})
        Else
            If Th_{k-1} <= Th_P
                Th_k = Th_B
            Else
                Th_k =Th_Q
            End
        End
    End
End
```
---

The values of $Th_A$, $Th_B$, $Th_P$, and $Th_Q$ are selected experimentally. In simulations conducted by the inventor, the following values achieved acceptable performance: $Th_P=\gamma_{max}-2$ and $Th_Q=\gamma_{max}-1$. In some embodiments, $Th_A$ and $Th_B$ are set equal to $\gamma_{max}$, though other values may also be used. The definition of func( ) may be func(x)=x−1. However, other linear or non-linear functions may also be used. These values are exemplary only and other values may also be experimentally selected. In the above pseudo code, the threshold $Th_k$ is always an integer value at each iteration. Using this approach for computing $Th_k$, the least square solution for calculating $(\alpha(\gamma_i,TUSC_k)$ and $\beta(\gamma_i,TUSC_k)$ may be reformulated as (5).

$$(\alpha(\gamma_i,TUSC_k,Th_k),\beta(\gamma_i,TUSC_k,Th_k))=(A_1^T A_1)^{-1} * A_1^T B_1 \quad (5)$$

where A1 and B1 are defined as (6).

$$A = \begin{bmatrix} (BF_1 \text{ xor } C_1) & USC_1 \\ \cdot & \cdot \\ \cdot & \cdot \\ (BF_L \text{ xor } C_L) & USC_L \end{bmatrix}, B = \begin{bmatrix} Th_k + E_1 \\ \cdot \\ \cdot \\ Th_k + E_L \end{bmatrix} \quad (6)$$

The above solution may include finding values for $(\alpha(\gamma_i, TUSC_k)$ and $\beta(\gamma_i, TUSC_k)$ for some or all degrees $\gamma_i$ of the variable nodes 302 and for some or all values within the range of values of $TUSC_k$, e.g. from 1 to TUSC as calculated prior to the first iteration. For example, if there are degree 6 and degree 7 variable nodes 302, and the range of $TUSC_k$ is presumed to be from 1 to the maximum degree (7), and there is 4000 bits long parity, the total number of parameters would be 2*4000*7=56,000, which may not be feasible where hardware storage is limited. In some embodiments, the range of possible values of $TUSC_k$ may be divided into R bins, where R is smaller than $TUSC_k$. For example, binning thresholds $bin\_th_1, bin\_th_2, \ldots bin\_th_{R-1}$ may be defined. In the case of R=4, the bins may be defined as:

Bin 1: $0<=TUSC_k<bin\_th_1$
Bin 2: $bin\_th_1<=TUSC_k<bin\_th_2$
Bin 3: $bin\_th_2<=TUSC_k<bin\_th_3$
Bin 4: $TUSC_k>=bin\_th_3$.

Using this approach, the total number of parameters $\alpha(\gamma_i,TUSC_k)$ and $\beta(\gamma_i,TUSC_k)$ will be just the number of degrees for variable nodes*number of bins*iteration range, which is 2*4*7=56 in one example. Bin thresholds may be selected experimentally based on simulated or expected performance (hardware storage requirements, speed of decoding, accuracy of decoding, etc.). In general, dividing values of TUSC among 4 bins has been found to be adequate. For example, assuming 4000 bits long parity, TUSC may be divided into ranges [0,1000], [1001,2000], [2001,3000],[3001,4000].

Using the binning approach, values of $\alpha(\gamma_i,TUSC_k)$ and $\beta(\gamma_i,TUSC_k)$ may be obtained by identifying the bin number for a given value of $TUSC_k$ (e.g., $TUSC_k$ within the range defined by the thresholds for that bin number) and retrieving previously calculated values for $(\gamma_i,TUSC_k)$ and $\beta(\gamma_i,TUSC_k)$ mapped to that bin number. Note that the values of $\alpha(\gamma_i,TUSC_k)$ and $\beta(\gamma_i,TUSC_k)$ corresponding to a given bin range may be discretized to have a limited number of fractional bits, e.g., 0, 1, or 2, to further reduce hardware complexity required for computations.

Sometimes the search for $\alpha(\gamma_i,TUSC_k)$ and $\beta(\gamma_i,TUSC_k)$ is not feasible. In such scenarios, the approach of (7) and (8) may be used.

$$(\alpha(y_i, TUSC_k, Th_k) = 1, \beta(y_i, TUSC_k, Th_k) = 1) \quad (7)$$

$$BF_i = \begin{cases} \text{Flip the bit if, } (BF_i \text{ xor } C_i) + USC_i \geq Th_k \\ \text{Don't flip, } (BF_i \text{ xor } C_i) + USC_i \leq Th_k \end{cases} \quad (8)$$

With the flip threshold $Th_k$ from step 414, each bit of $BF_i$ may be processed. For example, with i initialized 416 to one, each bit is processed until i is found 418 to be equal to n. In particular, at step 420, the algorithm 400 may include evaluating whether to flip the current value of $BF_i$ according to (1) or (8). If the condition of (1) or (8) is found to be met, bit $BF_i$ is flipped 422 ($BF_i$=!$BF_i$). If a bit is flipped, the values of $BF_i$ following flipping at step 422 are evaluated with respect to H to calculate TUSC. If TUSC is found 424 to be zero, the algorithm 400 ends. If not, then i is incremented 426 and processing continues to the evaluation 418. The current value of i is also incremented 426 in the case where the flip threshold is not found 420 to be met.

Once all bit positions i are found 418 to have been processed, processing continues to step 406 to determine whether the maximum iterations have been performed. If not, processing continues at step 410. As noted above, step 408 may be omitted after the first iteration since TUSC is also evaluated at step 424 whenever a bit is flipped. If the maximum number of iterations are found 406 to have been performed, the algorithm 400 ends.

When the algorithm 400 ends, the current values of BFi are then decoded as an estimate of the data originally encoded as Ci. In some instances, where unsatisfied checks remain after the algorithm 400 ends, an error may be returned indicating that the read data is corrupted.

Figure 5:
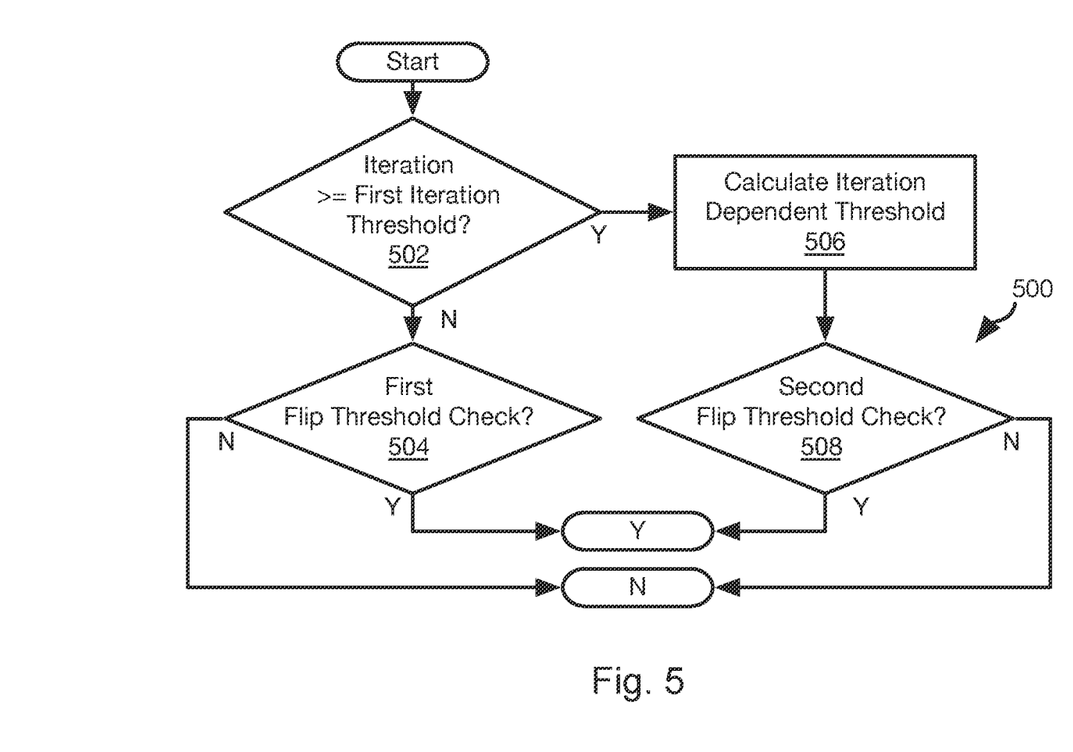
FIG. 5 is a process flow diagram of a method for determining a bit flipping threshold in accordance with an embodiment of the present invention.

Referring to FIG. 5, in some embodiments, the flip threshold is calculated based on some or all of channel information, iteration count, and bit position. The algorithm 500 may be executed in place of the flip threshold check 420 of the algorithm 400. The algorithm 500 may use the variables noted above with respect to the algorithm 400 and additionally use the variable $CM_i$, which denotes channel mismatch information for bit position i: $CM_i=C_i$ xor $BF_i$.

The algorithm 400 within which the algorithm 500 is implemented may be implemented using the same approach described above or may be further modified. The modifications described below may also be used to implement the algorithm 400 even when the algorithm 500 is not used.

In a first modification, the bit flipping decision at step 420 uses the simplified case of (8), with the threshold $Th_k$ calculated according to any of the approaches described herein.

In a second modification, $Th_k$ is calculated at step 414 using the pseudo code of Algorithm 2, below:

---
Algorithm 2
---

```
If TUSC <= γ_max
    Th_k = TUSC
Else
    If k=1
        Th_k = γ_max
    Else
        If TUSC<=USC_Iteration_Thresh and k modulo m==0
            Th_k = Th_A (where Th_A=γ_max -2)
        If number of bits flips in the last iteration from the decoder == 0
            Th_k = Th_k - 1
        Else
            If Th_k <= Th_B (where Th_B= γ_max -2)
                Th_k = Th_C (where Th_C=γ_max -1)
            Else
                Th_k = Th_D (where Th_D=γ_max -1)
            End
        End
    End
End
```

The value of USC_Iteration_Thresh and m may be selected experimentally. The values of $Th_A$, $Th_B$, $Th_C$, and $Th_D$ given in the pseudo code are examples only and other values may also be determined by experimentation. In Algorithm 2, TUSC and iteration count (k) are used for an aggressive threshold ($\gamma_{max}-2$) but are conditioned on TUSC<=USC_Iteration_Thresh and (k modulo m)==0. This ensures that the aggressive threshold is only used every m iterations and only when TUSC is below USC_Iteration_Thresh.

In Algorithm 2, $Th_k$ may be reduced every time an iteration occurs without any bits being flipped but is otherwise constrained to be $Th_C$, $Th_D$, or a value in between $Th_C$ and $Th_D$. $Th_C$ and $Th_D$ are identical in the illustrated embodiment but may be different with $Th_C<Th_D$. $Th_C$ and $Th_D$ may also both be greater than the more aggressive threshold ($Th_A$) that is used under the conditions described above. In the illustrated example, $Th_D$ is selected to be $\gamma_{max}-1$, which may provide improved decoding performance as compared to $\gamma_{max}$.

The above-noted features of Algorithm 2 may improve the decoder convergence, which, in essence, acheives a lower latency and higher throughput for the decoder.

Referring again to FIG. 5, the algorithm 500 may include evaluating 502 whether the current iteration is greater than a first iteration threshold. If not, the algorithm 500 may include evaluating 504 whether the flip threshold is met for the current bit position using a first flip threshold check. The first flip threshold check may be performed as described above with respect to step 420 of the algorithm 400 and may use the approach of either of (1) or (8) using the flip threshold $Th_k$ calculated according to whichever of Algorithm 1 and Algorithm 2 is used at step 414.

If the iteration threshold is found 502 to be met, the algorithm 500 may include calculating 506 a bitwise threshold $Th^k_i$ and evaluating 508 whether a second flip threshold is met. The bitwise threshold $Th^k_i$ may be calculated according to Algorithm 3 and the second flip threshold check may be implemented according to (9) described below.

---
Algorithm 3
---

```
If (k>=start_recovery_iter and TUSC>γ_max and
    TUSC<=max(recovery_usc,recovery_usc_low,recovery_usc_lower)
    If TUSC<=recovery_usc and CM_i == 0
        Channel_enable =1
        Th^k_i = Th_M (where Th_M=γ_max -2)
    If TUSC<=recovery_usc_low and CM_i == 1
        Channel_enable =1
        Th^k_i = Th_N (where Th_N=γ_max -2)
    If k>=start_recovery_iter and k modulo l== 0 and
        TUSC<=recovery_usc_low)
        Th^k_i =Th_O (where Th_O= γ_i -1)
        Channel_enable =0
    else
        If (k>=second_recovery_iter and k modulo z ==0 and
            TUSC<=recovery_usc_lower and γ_i=γ_max -1)
            Th^k_i = Th_Q (where Th_Q=γ_max -3)
            Channel_enable =0
        else
            if (k>=second_recovery_iter and
                TUSC<=recovery_usc_low )
                Channel_enable =1
                Th^k_i = Th_R (where Th_R=γ_max -2)
```

The parameters $Th_M$, $Th_N$, $Th_O$, $Th_Q$, $Th_R$, start_recovery_iter, second_recovery_iter, recovery_usc, recovery_usc_low, recovery_usc_lower, l and p may be selected heuristically. The values of l and z may be the same or different. $Th_M$ and $Th_N$ are shown as being identical in Algorithm 3 but may also be different from one another. In Algorithm 3, the flip threshold may change for each bit in the codeword depending upon the channel mismatch information, TUSC and degree of the bit. The parameter $Channel_{enable}$ may be used to control the channel mismatch information usage in the bit flipping criterion, such as the bit flipping criterion of (9).

$$BF_i = \begin{cases} \text{Flip the bit if, } Channel_{enable} * (BF_i \text{ xor } C_i) * \\ \quad \alpha(y_i, TUSC_k, Th^k_i) + \\ \quad \beta(y_i, TUSC_k, Th^k_i) * USC_i \geq Th^k_i \\ \text{Don't flip, } Channel_{enable} * (BF_i \text{ xor } C_i) * \alpha(y_i, TUSC_k, Th^k_i) + \\ \quad \beta(y_i, TUSC_k, Th^k_i) * USC_i < Th^k_i \end{cases} \quad (9)$$

Algorithm 3 and (9) include the following features, any of which can be used in isolation:

Algorithm 3 and (9) implement a flip threshold algorithm which calculates flip thresholds for each bit position i in $BF_i$ based on the information available.

Algorithm 3 imposes a special condition when this algorithm will be used to find the flip threshold, which is that the iteration count crosses a specified threshold and that TUSC is less than a predefined threshold.

Algorithm 3 imposes more aggressive (lower) thresholds at predefined periods (k modulo l==0, k modulo z==0, l and k being integers greater than 2 that may be equal or non-equal).

Algorithm 3 calculates the threshold differently at different points along the iteration count (start_recovery_iter, second_recivovery_iter).

Algorithm 3 determines when channel information will be used or not used as part of evaluating whether to flip a given bit position ( . . . $Channel_{enable}*$ . . . ).

Algorithm 3 uses channel mismatch of a bit position i (i.e., whether a bit position has previously been flipped) as a criteria for selecting the flip threshold $Th^k_i$ for that bit position.

If the condition of (9) for flipping BFi is found to be met, then the result of the Algorithm 500 is positive (Y). If not, the result is negative (N). Likewise, if the condition of step 504 is found to be met (the condition of (1) or (8)), then the result of the Algorithm 500 is positive (Y). If not, the result is negative (N). The method 400 may then proceed as described above with respect to the positive or negative outcomes of the evaluation 420 of the method 400.

The above-described algorithms are exemplary only. For example, there may be any number of iteration thresholds such that for any range of iteration numbers, any of Algorithm 1, Algorithm 2, Algorithm 3, or modified versions thereof, may be used to calculate $Th_k$ or $Th^k_i$ for that range of iteration numbers. Likewise, any of the above described approaches (1), (8), and (9) for determining whether to flip a bit may be used for a predefined range of iteration numbers.

The present invention may be embodied in other specific forms without departing from its spirit or essential characteristics. The described embodiments are to be considered in all respects only as illustrative, and not restrictive. In particular, although the methods are described with respect to a NAND flash SSD, other SSD devices may also benefit from the methods disclosed herein. The scope of the invention is, therefore, indicated by the appended claims, rather than by the foregoing description. All changes which come within the meaning and range of equivalency of the claims are to be embraced within their scope.

What is claimed is:

1. A controller for a storage device, the controller being programmed to:
    read a plurality of bits Ci from the storage device, where i=0 to N−1 and N is a number of bits of the plurality of bits Ci;
    initialize a plurality of bit flip decisions BFi for each bit Ci such that BFi=Ci; and
    perform a plurality of bit flipping, iterations such that, for each bit flipping iteration k of the plurality of bit flipping iterations, a threshold condition for flipping each bit flip decision of the plurality of bit flip decisions BFi is a function of k;
    wherein each bit flipping iteration k of the plurality of bit flipping iterations comprises:
    a) determine a number of unsatisfied checks TUSCk for BFi with respect to a parity matrix H;
    (b) if TUSCk is zero or k meets an iteration threshold, cease performing the plurality of bit flipping iterations; and
    (c) if TUSCk is not zero and k does not meet the iteration threshold, for each bit flip decision BFi, flip each bit flip decision BFi if a threshold condition is met, the threshold condition being a function of the each bit flipping iteration k.

2. The controller of claim 1, wherein the controller is programmed to calculate the threshold condition as a function of a bit flipping threshold Thk, wherein Thk varies periodically with respect to k.

3. The controller of claim 2, wherein the controller is programmed to reduce Thk to a minimum value every z iterations, where z is an integer greater than 1.

4. The controller of claim 3, wherein the controller is programmed to set Thk to one or more values above the minimum value when z is not an integer greater than 1.

5. The controller of claim 4, wherein;
    the minimum value is $\gamma\_max-2$, where $\gamma\_max$ is a greatest number of 1 s in any one column of H; and
    wherein the one or more values above the minimum value include $\gamma\_max-1$.

6. The controller of claim 1, wherein the controller is programmed to calculate the threshold condition as a function of a bit flipping threshold Thki that is calculated by the controller for each bit flip decision BFi.

7. The controller of claim 6, wherein Thki is a function of BFi xor Ci.

8. The controller of claim 7, wherein Thki is a function of TUSCk.

9. The controller of claim 8, wherein Thki is a function of $\gamma\_i$, where $\gamma\_i$ is a number of non-zero entries in column i of H.

10. The controller of claim 1, wherein for a first range of values of TUSCk the threshold condition is a function of BFi xor Ci and for a second range of values of TUSCk the threshold condition is not a function of BFi xor Ci.

11. The controller of claim 1, wherein the threshold condition is a function of a bit flipping threshold Thk;
    wherein the controller is programmed to calculate Thk according to Algorithm 2.

12. The controller of claim 1, wherein:
    the threshold condition is a function of a bit flipping threshold Thk;
    the controller is programmed to calculate Thk according to Algorithm 2 for iterations k below an iteration threshold; and
    the controller is programmed to calculate Thk according to Algorithm 3 for iterations k above the iteration threshold.

13. The controller of claim 1, wherein the threshold condition is
    where Thk is a bit flip threshold, $\gamma\_i$ is a number of non-zero entries in column i of H, USCi is a number of the unsatisfied checks TUSCk that are connected to bit position i in H, and $\alpha(\gamma\_i, \_k)$ and $\beta(\gamma\_i, \_k)$ are predefined parameters.

14. The controller of claim 13, wherein $\alpha(\gamma\_i,k)$ and $\beta(\gamma\_i, \_k)$ are each equal to 1.

15. A controller for a storage device, the controller being programmed to:
    read a plurality of bits Ci from the storage device, where i=0 to N−1 and N is a number of bits of the plurality of bits Ci:
    initialize a plurality of bit flip decisions BFi for each bit Ci such that BFi=Ci; and
    perform a plurality of iterations k by, at each iteration k:
    (a) determine a number of unsatisfied checks TUSCk for BFi with respect to a parity matrix H;
    (b) if TUSCk is zero or k meets a maximum iteration threshold, cease performing the plurality of iterations k; and
    (c) if TUSCk is not zero and k does not meet the maximum iteration threshold, for each bit position i:
    periodically set a bit flip threshold Thk to be a minimum value when TUSCk is below an unsatisfied check threshold;
    when TUSCk is not below the unsatisfied check threshold, set Thk to be one or more values higher than the minimum value; and
    flip BFi at bit position i, if a threshold condition is met, the threshold condition being a function of Thk.

16. The controller of claim 15, wherein Thk is a function of one or more of k, $\gamma\_max$, and a Thk-1, where $\gamma\_max$ is equal to a maximum number of ones in any column i of H.

17. The controller of claim 16, wherein:
the minimum value is $\gamma\_max-2$, where $\gamma\_max$ is a greatest number of 1 s in any one column of H.

18. The controller of claim 17, wherein the one or more values higher than the minimum value include $\gamma\_max-1$.

19. The controller of claim 15, wherein the threshold condition is where $\gamma\_i$ is a number of nonzero entries in column i of H, and $\alpha(\gamma\_i, \_k)$ and $\beta(\gamma\_i, \_k)$ are predefined parameters.

\* \* \* \* \*